United States Patent
Lamesch

(10) Patent No.: US 9,551,738 B2
(45) Date of Patent: Jan. 24, 2017

(54) ROBUST CAPACITIVE MEASUREMENT SYSTEM

(75) Inventor: Laurent Lamesch, Reichlange (LU)

(73) Assignee: IEE International Electronics & Engineering S.A., Echternach (LU)

( * ) Notice: Subject to any disclaimer, the term of this patent is extended or adjusted under 35 U.S.C. 154(b) by 658 days.

(21) Appl. No.: 13/701,158

(22) PCT Filed: Jun. 8, 2011

(86) PCT No.: PCT/EP2011/059539
§ 371 (c)(1),
(2), (4) Date: Feb. 11, 2013

(87) PCT Pub. No.: WO2011/154467
PCT Pub. Date: Dec. 15, 2011

(65) Prior Publication Data
US 2013/0141121 A1   Jun. 6, 2013

(30) Foreign Application Priority Data
Jun. 8, 2010   (LU) ......................... 91 695

(51) Int. Cl.
*G01R 27/26* (2006.01)
*H03K 17/955* (2006.01)

(52) U.S. Cl.
CPC ......... *G01R 27/2605* (2013.01); *H03K 17/955* (2013.01); *H03K 2217/96077* (2013.01);
(Continued)

(58) Field of Classification Search
CPC ............ G01R 27/2605; G01R 31/2884; G01R 31/3004; G01R 31/31715; G01R 31/31701; H03K 17/955; H03K 2217/906705; H03K 2217/960775; H03K 2217/96077; H01L 22/34
(Continued)

(56) References Cited
U.S. PATENT DOCUMENTS 4,879,508 A * 11/1989 Andermo ................. 324/690
5,461,320 A * 10/1995 Strack et al. ............. 324/681
(Continued)

FOREIGN PATENT DOCUMENTS

WO   2008039924 A2   9/2007
WO   2008131213 A1   10/2008

OTHER PUBLICATIONS

International Search Report; International Application No. PCT/EP2011/059539; International Application Filing Date Jun. 8, 2011; Mail date Sep. 9, 2011.
(Continued)

*Primary Examiner* — Melissa Koval
*Assistant Examiner* — Felicia Farrow
(74) *Attorney, Agent, or Firm* — Reising Ethington P.C.

(57) ABSTRACT

A capacitive sensing circuit is disclosed, wherein the mixer is directly connected to the sense electrode. The AC transimpedance amplifier in front of the mixer in prior art is removed and replaced by a differential DC transimpedance amplifier respectively integrator.

The mixer DC offset voltage or current together with the large amplification factor required after the mixer now would result in an inacceptable DC offset at the output of the signal chain. In order to eliminate the effect of the mixer offset, the amplifying stages after the mixer are AC coupled to the mixer output and one of the signals entering the mixer is phase modulated or amplitude modulated with a known low frequency signal. An additional mixer after the AC coupled amplifying stages is driven with the same low frequency modulating signal, resulting in the wanted DC output signal responsive to the capacitance to be measured.

12 Claims, 3 Drawing Sheets

(52) U.S. Cl.
CPC ............ *H03K 2217/960705* (2013.01); *H03K 2217/960775* (2013.01)

(58) Field of Classification Search
USPC .............................. 324/681, 750.3, 750.17, 754.01,324/660–661, 656, 658, 665, 606, 667, 676,324/672, 674, 632, 68
See application file for complete search history.

(56) References Cited

U.S. PATENT DOCUMENTS

| | | | | |
|---|---|---|---|---|
| 6,025,726 | A * | 2/2000 | Gershenfeld et al. | ........ 324/671 |
| 6,225,710 | B1 | 5/2001 | Palata | |
| 7,868,874 | B2 | 1/2011 | Reynolds | |
| 2005/0253596 | A1* | 11/2005 | Kitano | ............ G01C 19/56 324/667 |
| 2007/0146019 | A1* | 6/2007 | Foote | ....................... G01D 5/24 327/100 |
| 2008/0018611 | A1 | 1/2008 | Serban et al. | |
| 2008/0030353 | A1 | 2/2008 | O'Toole | |
| 2009/0153152 | A1* | 6/2009 | Maharyta et al. | ............ 324/684 |
| 2010/0110037 | A1 | 5/2010 | Huang et al. | |

OTHER PUBLICATIONS

Datasheet "MC1496, MC1496B BalancedModulators/Demodulator, ON Semiconductors".

Joshua Smith, "Electric Field Sensing for Graphical Interfaces" IEEE Computer Graphics and Applications, published in Computer Graphics I/O Devices, Issue May/Jun. 1998, pp. 54-60.

Paul Horowitz and Winfield Hill, "The Art of Electronics, 2nd edition", p. 185,Fig.4.18.

Arthur B. Williams and Fred J. Taylor, "Electronic Filter Design Handbook", Chapters. 2, 3 and 11.

C. Toumazou, "Current Conveyor Theory and Practice, A.S. Sedra and G.W. Roberts Published in •Advances in Analog Integrated Circuit Design" Peter Peregrinus Limited, London, England, pp. 93-126, 1990.

Written Opinion, International Application No. PCT/EP2011/059539; International Application Filing Date Jun. 8, 2011; Mail date Sep. 9, 2011.

* cited by examiner

ROBUST CAPACITIVE MEASUREMENT SYSTEM

FIELD OF THE INVENTION

The present invention generally relates to the technical field of capacitive measurement circuits and more specifically to a capacitive measurement system having one or more electrodes, in which the characteristics of a conductive body such as shape and location are determined by means of capacitive coupling via the electrically conductive body.

BACKGROUND OF THE INVENTION

Capacitive measurement and/or detection systems have a wide range of applications, and are among others widely used for the detection of the presence and/or the position of conductive body in the vicinity of an electrode of the system. A capacitive sensor, called by some electric field sensor or proximity sensor, designates a sensor, which generates a signal responsive to the influence of what is being sensed (a person, a part of a person's body, a pet, an object, etc.) upon an electric field. A capacitive sensor generally comprises at least one antenna electrode, to which is applied an oscillating electric signal and which thereupon emits an electric field into a region of space proximate to the antenna electrode, while the sensor is operating. The sensor comprises at least one sensing electrode—which could comprise the one or more antenna electrodes themselves—at which the influence of an object or living being on the electric field is detected.

The technical paper entitled "Electric Field Sensing for Graphical Interfaces" by J. R. Smith, published in Computer Graphics I/O Devices, Issue May/June 1998, pp 54-60 describes the concept of electric field sensing as used for making non-contact three-dimensional position measurements, and more particularly for sensing the position of a human hand for purposes of providing three dimensional positional inputs to a computer. Within the general concept of capacitive sensing, the author distinguishes between distinct mechanisms he refers to as "loading mode", "shunt mode", and "transmit mode" which correspond to various possible electric current pathways. In the "loading mode", an oscillating voltage signal is applied to a transmit electrode, which builds up an oscillating electric field to ground. The object to be sensed modifies the capacitance between the transmit electrode and ground. In the "shunt mode", which is alternatively referred to as "coupling mode", an oscillating voltage signal is applied to the transmit electrode, building up an electric field to a receive electrode, and the displacement current induced at the receive electrode is measured, whereby the displacement current may be modified by the body being sensed. In the "transmit mode", the transmit electrode is put in contact with the user's body, which then becomes a transmitter relative to a receiver, either by direct electrical connection or via capacitive coupling.

The capacitive coupling is generally determined by applying an alternative voltage signal to a capacitive antenna electrode and by measuring the current flowing from said antenna electrode either towards ground (in the loading mode) or into the second electrode (receiving electrode) in case of the coupling mode. This current is usually measured by means of a transimpedance amplifier, which is connected to the sensing electrode and which converts a current flowing into said sensing electrode into a voltage, which is proportional to the current flowing into the electrode.

FIG. 1 shows a typical prior art circuit configured to measure an unknown capacitance in so-called 'loading' mode meaning that the capacitance between an electrode of a capacitive sensor and ground or earth is measured.

An AC voltage source 1 generates an AC voltage signal of known frequency and amplitude, for example a periodic sine wave of 100 kHz and 1 V peak amplitude. The output node 2 of AC voltage source 1 is connected to the non-inverting input of an operational amplifier 3. Operational amplifier 3 is configured as transimpedance amplifier. Operational amplifier 3, through the feedback action of associated feedback impedance 4 (preferably a capacitance connected in parallel to a resistance, whereby the impedance of the capacitance at the operating frequency is at least 10 times smaller than the resistance), maintains substantially the same potential on its inverting input as on its non-inverting input, thereby keeping sense node 5 at the same potential than AC voltage source output 2. The unknown capacitance 6 to be measured accordingly has the AC voltage source voltage applied across its "plates".

The current flowing through unknown capacitance 6 is then given by its capacitance and the known AC voltage source voltage, said current flowing also through feedback impedance 4 as the input current into the non-inverting input of amplifier 3 is substantially zero.

The voltage on output 7 of amplifier 3 is accordingly responsive to the AC voltage source voltage and the unknown capacitance. This amplifier output voltage is then mixed with mixer 8 (for example a switching mixer or a multiplier) whereby the local oscillator input of mixer 8 is driven by the AC voltage source output 2. The output of mixer 8 is a DC voltage superimposed with multiples of the AC voltage source frequency, the DC voltage level being responsive to the amplitude of the amplifier output 7 and thereby of AC voltage source output voltage 2 and unknown capacitance 6.

As only the DC voltage is desired, the multiples of the AC voltage source frequency are filtered out with low pass filter 10. The output signal 11 of the low pass filter is a DC voltage responsive to the AC voltage source voltage and the unknown capacitance. Furthermore, an adjustable phase shift (preferably of selectable steps of 0 and 90 degrees) can be introduced between the AC voltage source output 2 and local oscillator input of mixer 8, thereby allowing the measurement of the complex impedance 6 instead of a capacitance 6.

FIG. 2 shows a typical prior art circuit configured to measure an unknown capacitance in so-called 'coupling' mode meaning that the capacitance between two electrodes of a capacitive sensor is measured.

In this variant, an AC voltage source 1 generates an AC voltage signal of known frequency and amplitude, for example a periodic sine wave of 100 kHz and 1 V peak amplitude. The output node 2 of AC voltage source 1 is connected to the first plate of unknown capacitance 6. The second plate of unknown capacitance 6 is connected to the inverting input of an operational amplifier 3. The non-inverting input of amplifier 3 is connected to ground. Operational amplifier 3, through the feedback action of the associated feedback impedance 4 (preferably a capacitance connected in parallel to a resistance, whereby the impedance of the capacitance at the operating frequency is at least 10 times smaller than the resistance), maintains substantially the same potential on its inverting input as on its non-inverting input, thereby keeping sense node 5 at ground potential. The unknown capacitance 6 to be measured accordingly has the AC voltage source voltage applied across its "plates".

The current flowing through unknown capacitance 6 is then given by its capacitance and the known AC voltage source voltage, said current flowing also through feedback impedance 4 as the input current into the non-inverting input of amplifier 3 is substantially zero.

The voltage on output 7 of amplifier 3 is accordingly responsive to the AC voltage source voltage and the unknown capacitance. This amplifier output voltage is then mixed with mixer 8 (for example a switching mixer or a multiplier) whereby the local oscillator input of mixer 8 is driven by the AC voltage source output 2. The output of mixer 8 is a DC voltage superimposed with multiples of the AC voltage source frequency, the DC voltage level being responsive to the amplitude of the amplifier output 7 and thereby of AC voltage source output voltage 2 and unknown capacitance 6.

As only the DC voltage is desired, the multiples of the AC voltage source frequency are filtered out with low pass filter 10. The output signal 11 of the low pass filter is the DC voltage responsive to the AC voltage source voltage and the unknown capacitance. Furthermore, an adjustable phase shift (preferably of selectable steps of 0 and 90 degrees) can be introduced between the AC voltage source output 2 and local oscillator input of mixer 8, thereby allowing the measurement of the complex impedance 6 instead of a capacitance 6.

For both prior art circuits, the gain of the transimpedance amplifier formed by the operational amplifier 3 and the feedback impedance 4 is configured to be as large as possible in order to achieve low noise performance, and the DC gain of the signal chain stages following the mixer can subsequently be made comparatively low, to avoid DC offset problems. For example, in a practical implementation, for an operating frequency of 100 kHz and a source amplitude of 1 V, the feedback impedance would be chosen to be a capacitor of 100 pF in parallel with a resistance of 1 MΩ.

However, the output signal range of the operational amplifier 3 is limited, for example to an amplitude of 2 V peak for a 5 V power supply. This implies that a parasitic AC current injected into the sense electrode of the capacitive sensor of more than 126 μA peak amplitude will drive the operational amplifier into saturation and introduce an error into the measurement of the unknown capacitance. Such parasitic AC currents are e.g. generated by external noise sources, one example being the so-called 'Bulk current injection' (BCI) test during the qualification of an occupant detection system.

OBJECT OF THE INVENTION

The object of the present invention is to provide a robust capacitive measurement circuit, which is less sensitive to such parasitic AC currents.

GENERAL DESCRIPTION OF THE INVENTION

In order to overcome the abovementioned problems, the present invention proposes a capacitive sensing circuit, wherein the mixer is connected upstream of the amplifying stage. The AC transimpedance amplifier upstream of the mixer in the prior art circuits is removed and replaced by a differential DC transimpedance amplifier respectively by an integrator.

The mixer DC offset voltage or current together with the large amplification factor required after the mixer now would result in an inacceptable DC offset at the output of the signal chain. In order to eliminate the effect of the mixer offset, the amplifying stages after the mixer are AC coupled to the mixer output and one of the signals entering the mixer is phase modulated or amplitude modulated with a known low frequency signal. An additional mixer after the AC coupled amplifying stages is driven with the same low frequency modulating signal, resulting in the wanted DC output signal responsive to the capacitance to be measured.

In a first preferred embodiment the capacitive detection system comprises an antenna electrode, a first AC signal generator configured to generate a first AC voltage signal, a second AC signal generator configured to generate a second AC voltage signal, said second AC voltage having a lower frequency than said first AC signal, and a first mixer for mixing said first AC voltage signal and said second AC voltage signal and for generating a modulated AC voltage signal. One of said first AC signal generator or said first mixer is operatively coupled to said antenna electrode to apply said first AC voltage signal or said modulated AC voltage signal to said antenna electrode.

The capacitive detection system further comprises a control and evaluation unit operatively coupled to said antenna electrode or a separate receiving electrode, said control and evaluation unit comprising a current measurement circuit configured to measure current signals, said current signals comprising amplitude and/or phase of a current flowing in said antenna electrode or in said separate receiving electrode, said control and evaluation unit being configured to determine a capacitance to be measured based upon said measured current signals, and to output an output signal indicative of said determined capacitance. According to one aspect of the invention said current measurement circuit comprises a differential transimpedance amplifier circuit comprising a common mode voltage setting input, an inverting input, a non-inverting input and an output, wherein said inverting input and said non-inverting input of said transimpedance amplifier circuit are operatively connected to said antenna electrode or said separate receiving electrode by means of a multiplexer in such a way that said inverting input and said non-inverting input are alternately supplied with said current flowing in said antenna electrode or in said separate receiving electrode, said multiplexer being operatively coupled to and controlled by the other one of said first AC signal generator or said first mixer.

In one variant of the above system, said first AC signal generator is operatively coupled to said antenna electrode to apply said first AC voltage signal to said antenna electrode and said multiplexer is operatively coupled to said first mixer and controlled by said modulated AC voltage signal. In an alternative variant said first mixer is operatively coupled to said antenna electrode to apply said modulated AC voltage signal to said antenna electrode and said multiplexer is operatively coupled to said first AC signal generator and controlled by said first AC voltage signal.

In one embodiment of the capacitive detection system, said multiplexer is operatively coupled to the other one of said first AC signal generator or said first mixer by means of an adjustable phase shifter, so that said multiplexer is controllable by different phase positions of said first AC voltage signal or said modulated AC voltage signal.

Finally an output signal at the output of said differential transimpedance amplifier circuit is preferably filtered by means of a bandpass filter and subsequently mixed with the second AC voltage signal of said second AC signal generator.

BRIEF DESCRIPTION OF THE DRAWINGS

Further details and advantages of the present invention will be apparent from the following detailed description of not limiting embodiments with reference to the attached drawings, wherein.

DESCRIPTION OF PREFERRED EMBODIMENTS

Figure 3:
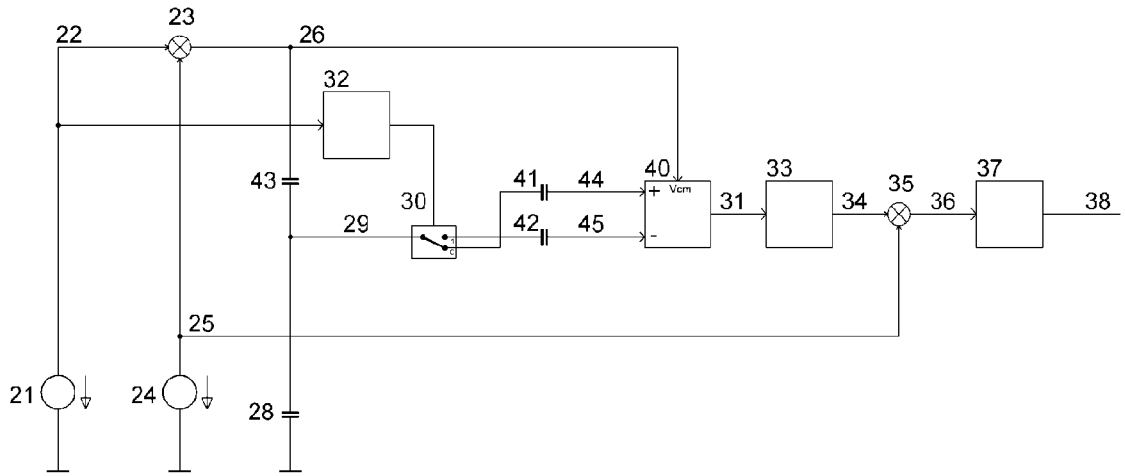
FIG. 3 a first embodiment of a 'loading' mode sensing circuit according to the present invention.

The circuit shown in FIG. 3 is a first embodiment allowing to substantially improve the immunity of the capacitance measurement circuit against injection of external parasitic AC currents. The capacitive measurement circuit is working in the so-called loading mode.

AC voltage source 21 generates an AC voltage signal of known frequency and amplitude, for example a periodic sine wave of 100 kHz and 1 V peak amplitude. Its output node 22 is connected to the input of adjustable phase shifter 32, and a first input of mixer 23. A second AC voltage source 24 generates a second AC voltage signal of know frequency and amplitude, but of lower frequency than the output frequency of AC voltage source 21, for example a periodic square wave of 1 kHz and 1V peak amplitude.

The output 25 of AC voltage source 24 is connected to the second input, the local oscillator input, of mixer 23. Mixer 23 multiplies the signals at its two inputs. For the specific example signals described above, a phase modulated sine wave will be generated at its output 26, that is for the first half of the period of the output signal of AC voltage source 24, the output 26 will be identical to the output signal of AC voltage source 21, and during the second half of the period of AC voltage source 24, the output 26 will be the inverted version of the output signal of AC voltage source 21.

Obviously, different waveforms can be used instead of the square waveform for AC voltage source 24, for example a so-called pseudo random noise binary sequence, or a swept frequency or stepped frequency square wave.

The output 26 of mixer 23 is fed into the sense to guard capacitance 43 of the capacitive sensor, and into the common mode voltage setting input of differential transimpedance amplifier 40. The differential transimpedance amplifier 40 keeps both of its inputs 44 and 45 at the same AC voltage level than its common mode voltage setting input, therefore nodes 44 and 45 are at the same AC potential than node 26. As multiplexer 30 always switches one of the left plates of capacitors 41 or 42 to the sense node 29, the sense node 29 thereby also has always the same AC voltage than node 26. Therefore, the AC voltage across sense to guard capacitance 43 is substantially zero, which allows the use of a guard electrode connected to node 26 to shield the sense electrode connected to node 29 against unwanted parasitic capacitances between sense node 29 and ground.

Also, unknown capacitance or impedance 28 has also the known AC voltage of node 26 across its plates. The current flowing through unknown capacitance or impedance 28 is therefore determined by its impedance and said known AC voltage. Said current is also flowing through multiplexer 30. The switch position of multiplexer 30 is steered by the polarity of the output signal of phase shifter 32. Said current is therefore flowing through capacitor 41 into the positive input 44 of differential transimpedance amplifier 40, or through capacitor 42 into the negative input 45 of differential transimpedance amplifier 40.

The differential transimpedance amplifier 40 amplifies the difference between the currents at its positive and negative inputs, and outputs an output voltage responsive to the input current difference. Multiplexer 30, together with differential transimpedance amplifier 40 therefore constitute a switching synchronous rectifier or switching synchronous demodulator with a current mode input and low AC input impedance, as the AC voltage on node 29 is substantially equal to the voltage on node 26 and does substantially not depend on the unknown capacitance or impedance 28.

The DC output voltage of said synchronous rectifier is responsive to the known AC voltage on node 29, the unknown capacitance or impedance 28 and the phase shift adjusted with the phase shifter 32. Typically, the phase shift of phase shifter 32 is first set to 0 degrees, then a first measurement is performed, then the phase shift is set to 90 degrees, then a second measurement is performed. By doing two measurements, the complex impedance of the unknown capacitor respectively impedance 28 can be calculated.

At the output 31 of differential transimpedance amplifier 40, a first AC signal with the same frequency as the frequency of the AC voltage source 24 will appear, superimposed with a second image AC signal of the signal of AC voltage source 24, shifted to twice the frequency of the output signal of AC voltage source 21. Further images will also be produced at the harmonics of the output signal of AC voltage 21.

As only the first, low frequency AC signal is of interest for the capacitive measurement, the higher frequency components will be eliminated by the amplifier 33, configured as bandpass filter, amplifying the first, low frequency AC signal and at the same time eliminating any DC offset signal at the output of mixer 31, and at the same time, substantially suppressing any signal which has frequency components other than the wanted, first low frequency signal. Amplifier 33 can for example be configured for the assumed 1 kHz output frequency of AC voltage source 24, with an AC coupled (capacitive coupled) 4-pole Butterworth lowpass filter with a cutoff frequency of 1.5 kHz, implemented for example with two operational amplifiers in the Sallen-Key configuration.

The resulting 1 kHz signal 34 at the output of bandpass amplifier 33 is then again mixed with the AC output signal of AC signal source 24 by mixer 35, and then amplified and low-pass filtered by amplifier 37 configured as low pass filter. Amplifier 37 can for example be implemented with a DC-coupled 2-pole Butterworth lowpass filter with a 100 Hz cutoff frequency, implemented for example with one operational amplifiers in the Sallen-Key configuration.

Another preferable, less complex option is to replace amplifier 37 with a passive low pass RC filter, having a DC gain of one when the amplifier 33 has been chosen to have sufficient gain for the application.

The DC voltage at the final output 38, will then due to the action of mixer 35 and low-pass action of amplifier 37, be responsive to the amplitude of the 1 kHz signal at the input of mixer 34. Finally, said DC voltage is responsive to the current through the unknown capacitance respectively impedance 28.

By performing the two consecutive measurements described above (the first one with phase shifter 32 adjusted to 0 degrees phase, the second one with phase shifter 32 adjusted to 90 degrees phase shift), and by combining the two consecutive DC levels obtained at the output 38, the impedance of the unknown capacitance respectively impedance 28 can be calculated.

The sequencing of the measurements and the measurement of the DC level at output 38 and the computation of the impedance of the unknown capacitance respectively impedance 28, is preferably performed by a microcontroller equipped with an integrated ADC (analog to digital converter). Alternatively, mixer 35 and low-pass filtering amplifier 37 can all be implemented inside a microcontroller equipped with an ADC, by connecting the ADC input directly to the output 34 of amplifier 33, and implementing the mixer in software by multiplying the ADC results alternatively with the values +1 and −1, synchronized to the AC voltage source 24, and then low-pass filtering or integrating the resulting values by software.

The differential transimpedance amplifier 40 can also be interpreted as a differential current mode input integrator, whereby the integrator keeps the AC voltages of each of the inputs 44 and 45 at the same AC potential than its common mode voltage setting input.

In order to optimally suppress injected parasitic AC currents, it is preferable to first perform a sweep or stepped scan of the frequency of the AC voltage source 21, detect the frequency or frequencies where the parasitic AC currents are located, and then set the measurement frequency of AC voltage source 21 to a frequency at which no parasitic AC current has been detected, and where also no subharmonic of a parasitic AC current is present.

Figure 4:
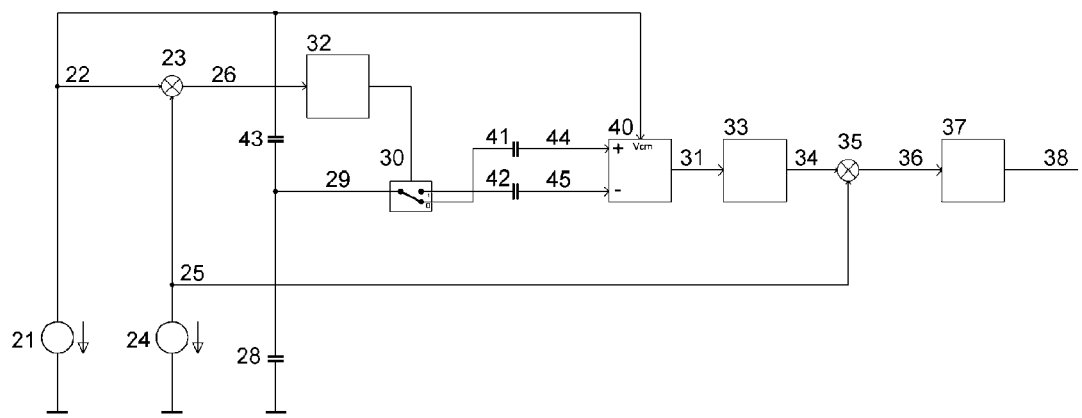
FIG. 4 an alternative embodiment of a 'loading' mode sensing circuit according to the present invention.

An alternative to the circuit shown in FIG. 3 is the circuit shown in FIG. 4. The capacitive measurement circuit is working in the so-called loading mode. The difference to the circuit in FIG. 3 is that the common mode voltage setting input of differential transimpedance amplifier 40 and the guard electrode (top plate of guard to sense capacitor 43) are now directly connected to the output 22 of the AC voltage source 21 and the input of phase shifter is connected to the output of mixer 26. The rest of the operation of the circuit is identical to the circuit in FIG. 3, except that common mode voltage setting input of differential transimpedance amplifier 40 and unknown capacitance respectively impedance 28 is now fed with a continuous wave, non modulated, periodic signal instead of a modulated one as in FIG. 3.

Figure 5:
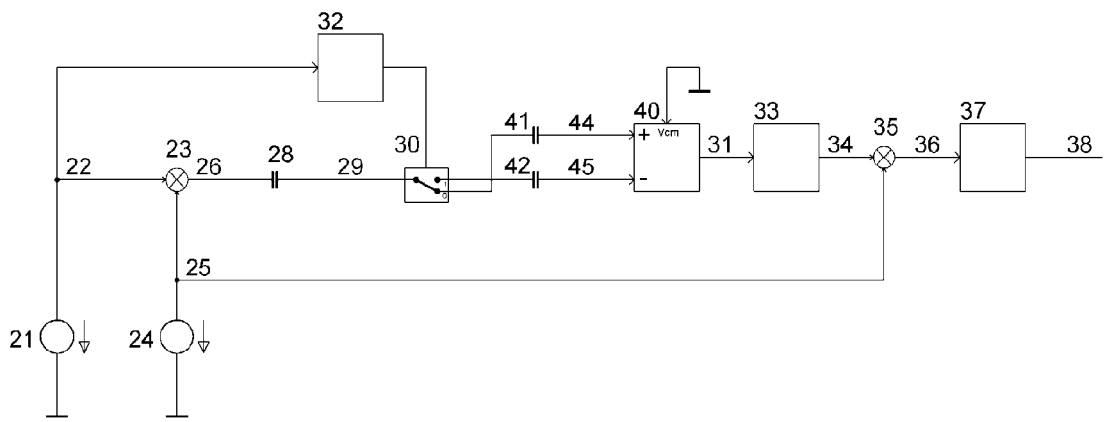
FIG. 5 a first embodiment of a 'coupling' mode sensing circuit according to the present invention.

FIG. 5 shows a circuit similar to the circuit in FIG. 3, except that the capacitive measurement circuit is working in the so-called coupling mode. Therefore, only the differences to the circuit in FIG. 3 will be described.

The output 26 of mixer 23 is connected to the unknown capacitance or impedance to be measured 28. The other node of the capacitance or impedance to be measured 28 is connected to the multiplexer 30. As the common mode voltage setting input of differential transimpedance amplifier 40 is connected to ground, the AC voltage on node 29, through capacitors 41 and 42 and multiplexer 30, will have zero AC voltage. Therefore, the known AC voltage of node 26 will also be present across unknown capacitance or impedance 28.

Similar to the circuit in FIG. 3, the current through unknown capacitance or impedance 28 will then be defined by the known AC voltage of node 26, and the impedance of unknown capacitance or impedance 28. Furthermore, as in FIG. 3, the DC voltage of output 38 will be responsive to said impedance.

Figure 6:
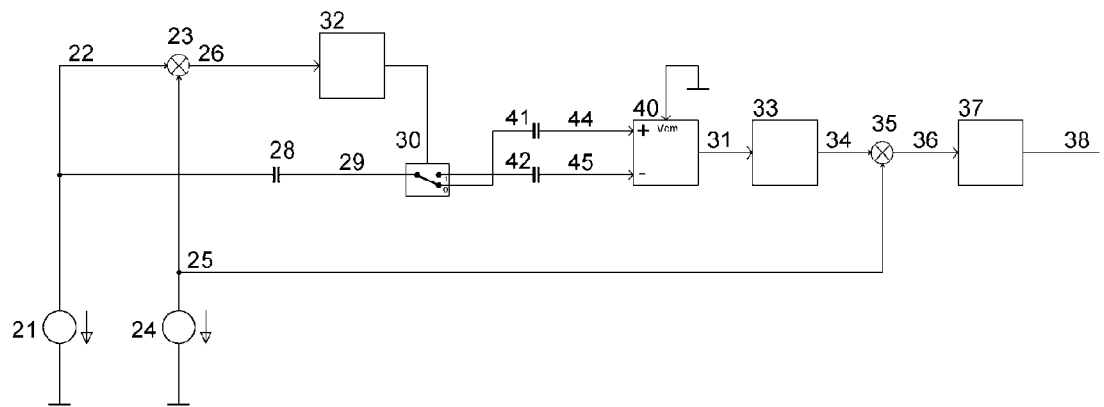
FIG. 6 an alternative embodiment of a 'coupling' mode sensing circuit according to the present invention.

An alternative to the circuit shown in FIG. 5 is the circuit shown in FIG. 6. The capacitive measurement circuit is working in the so-called coupling mode. The difference to the circuit in FIG. 5 is that the unknown capacitance or impedance to be measured 28 is now directly connected to the output 22 of the AC voltage source 21 and the input of phase shifter is connected to the output of mixer 26. The rest of the operation of the circuit is identical to the circuit in FIG. 5, except that the unknown capacitance respectively impedance 28 is now fed with a continuous wave, non modulated, periodic signal instead of a modulated one as in FIG. 5.

Figure 7:
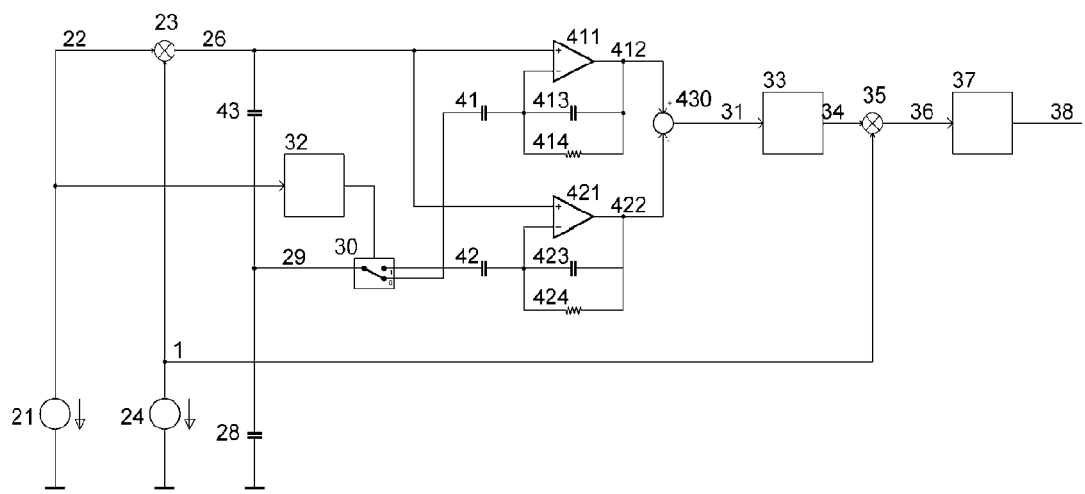
FIG. 7 shows a preferred embodiment of the circuit in FIG. 3.

FIG. 7 shows one preferred embodiment of the circuit in FIG. 3. Only the differences of the circuit in FIG. 7 compared to the circuit in FIG. 3 will be described. The differential transimpedance amplifier 40 in FIG. 3 is replaced by operational amplifiers 411 and 421, capacitors 413 and 423 and resistors 414 and 424 and difference amplifier 430. Difference amplifier 430 is preferably implemented with a suitably configured operational amplifier, an example can be found in reference "The Art of Electronics, $2^{nd}$ edition, Paul Horowitz and Winfield Hill", page 185, FIG. 4.18.

Operational amplifiers 411 and 412 are configured identically, so only the configuration of operational amplifier 411 will be described. Capacitor 41 couples the AC current coming from multiplexer 30 into the transimpedance amplifier made out of operational amplifier 411 and associated components. Capacitor 413 and resistor 414 close the feedback path around the operational amplifier and determine the gain of the transimpedance amplifier. Through the action of the feedback components 413 and 414, the voltage difference between the inputs of operational amplifier 411 is substantially kept to zero volts. As the positive input is connected to the output 26 of mixer 23, the input of the transimpedance amplifier built around operational amplifier 411 connected to capacitor 41 is at the same said AC potential, and, as operational amplifier 421 is configured identically, the input of the transimpedance amplifier built around operational amplifier 421 connected to capacitor 42 is also at the same said AC potential. Preferred values for capacitors 41 and 42 are 500 nF, for capacitors 413 and 423 10 nF, and for resistors 414 and 424 500 kΩ.

Figure 1:
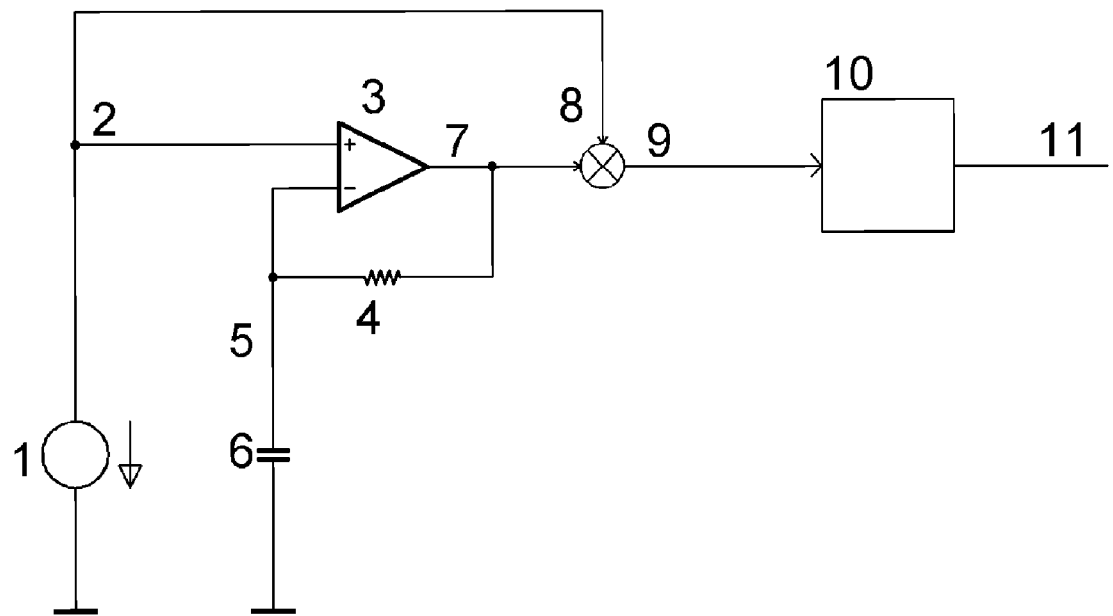
FIG. 1 shows a prior art 'loading' mode sensing circuit.
Figure 2:
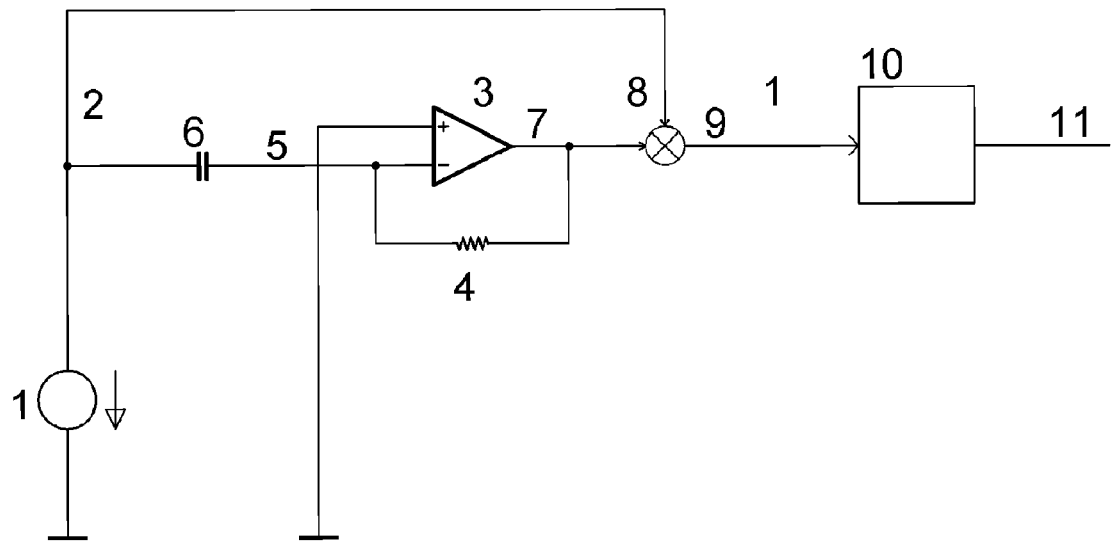
FIG. 2 shows a prior art 'coupling' mode sensing circuit.

An example for the operational amplifiers 411 and 421 is the LT1057 from Linear Technology. The voltage gain of the difference amplifier is preferably set to 10. As there is no amplifying device between the input of the capacitive measurement circuit and the mixer, and as the differential transimpedance amplifier is only required to amplify DC signals, the capacitive measurement circuit is substantially more insensitive to parasitic AC current injected into the sense electrode of the capacitive sensor (node 29 in FIG. 7). For example, for the circuit in FIG. 7 with the components as defined above, an injected parasitic current of 10 mA peak amplitude does not notably falsify the measurement result, which compares favourably to the 126 µA peak amplitude for the prior art circuit in FIG. 1.

The invention claimed is:
1. A capacitive detection system, comprising:
an antenna electrode;

a first AC signal generator configured to generate a first AC voltage signal, a second AC signal generator configured to generate a second AC voltage signal, said second AC voltage having a lower frequency than said first AC signal, a first mixer for mixing said first AC voltage signal and said second AC voltage signal and for generating a modulated AC voltage signal, wherein said first mixer is operatively coupled to said antenna electrode to apply said modulated AC voltage signal to said antenna electrode, a control and evaluation unit operatively coupled to said antenna electrode, said control and evaluation unit comprising a current measurement circuit configured to measure current signals, said current signals comprising amplitude and/or phase of a current flowing in said antenna electrode, said control and evaluation unit being configured to determine a capacitance to be measured based upon said measured current signals, and to output an output signal indicative of said determined capacitance;

wherein said current measurement circuit comprises a differential transimpedance amplifier circuit comprising a common mode voltage setting input, an inverting input, a non-inverting input and an output, wherein said inverting input and said non-inverting input of said transimpedance amplifier circuit are operatively connected to said antenna electrode by means of a multiplexer in such a way that said inverting input and said non-inverting input are alternately supplied with said current flowing in said antenna electrode, said multiplexer being operatively coupled to and controlled by said first AC signal generator.

2. The capacitive detection system according to claim 1, wherein said common mode voltage setting input of said differential transimpedance amplifier circuit is operatively coupled to said first mixer such that said modulated AC voltage signal is supplied to said common mode voltage setting input of said differential transimpedance amplifier circuit.

3. The capacitive detection system according to claim 1, wherein said multiplexer is operatively coupled to said first AC signal generator by means of an adjustable phase shifter, so that said multiplexer is controllable by different phase positions of said first AC voltage signal.

4. The capacitive detection system according to claim 1, wherein an output signal at the output of said differential transimpedance amplifier circuit is filtered by means of a bandpass filter and subsequently mixed with the second AC voltage signal of said second AC signal generator.

5. A capacitive detection system, comprising:
an antenna electrode;
a first AC signal generator configured to generate a first AC voltage signal,
a second AC signal generator configured to generate a second AC voltage signal, said second AC voltage having a lower frequency than said first AC signal,
a first mixer for mixing said first AC voltage signal and said second AC voltage signal and for generating a modulated AC voltage signal,
wherein said first mixer is operatively coupled to said antenna electrode to apply said modulated AC voltage signal to said antenna electrode,
a control and evaluation unit operatively coupled to a separate receiving electrode, said control and evaluation unit comprising a current measurement circuit configured to measure current signals, said current signals comprising amplitude and/or phase of a current flowing in said separate receiving electrode, said control and evaluation unit being configured to determine a capacitance to be measured based upon said measured current signals, and to output an output signal indicative of said determined capacitance;

wherein said current measurement circuit comprises a differential transimpedance amplifier circuit comprising a common mode voltage setting input, an inverting input, a non-inverting input and an output, wherein said inverting input and said non-inverting input of said transimpedance amplifier circuit are operatively connected to said separate receiving electrode by means of a multiplexer in such a way that said inverting input and said non-inverting input are alternately supplied with said current flowing in said separate receiving electrode, said multiplexer being operatively coupled to and controlled by said first AC signal generator.

6. The capacitive detection system according to claim 5, wherein said common mode voltage setting input of said differential transimpedance amplifier circuit is operatively coupled to ground.

7. The capacitive detection system according to claim 5, wherein said multiplexer is operatively coupled to said first AC signal generator by means of an adjustable phase shifter, so that said multiplexer is controllable by different phase positions of said first AC voltage signal.

8. The capacitive detection system according to claim 5, wherein an output signal at the output of said differential transimpedance amplifier circuit is filtered by means of a bandpass filter and subsequently mixed with the second AC voltage signal of said second AC signal generator.

9. A capacitive detection system, comprising:
an antenna electrode;
a first AC signal generator configured to generate a first AC voltage signal,
a second AC signal generator configured to generate a second AC voltage signal, said second AC voltage having a lower frequency than said first AC signal,
a first mixer for mixing said first AC voltage signal and said second AC voltage signal and for generating a modulated AC voltage signal,
wherein said first AC signal generator is operatively coupled to said antenna electrode to apply said first AC voltage signal to said antenna electrode,
a control and evaluation unit operatively coupled to said antenna electrode, said control and evaluation unit comprising a current measurement circuit configured to measure current signals, said current signals comprising amplitude and/or phase of a current flowing in said antenna electrode, said control and evaluation unit being configured to determine a capacitance to be measured based upon said measured current signals, and to output an output signal indicative of said determined capacitance;
wherein said current measurement circuit comprises a differential transimpedance amplifier circuit comprising a common mode voltage setting input, an inverting input, a non-inverting input and an output, wherein said inverting input and said non-inverting input of said transimpedance amplifier circuit are operatively connected to said antenna electrode by means of a multiplexer in such a way that said inverting input and said non-inverting input are alternately supplied with said current flowing in said antenna electrode, said multiplexer being operatively coupled to and controlled by said first mixer.

10. The capacitive detection system according to claim 9, wherein said common mode voltage setting input of said differential transimpedance amplifier circuit is operatively coupled to first AC signal generator such that said first AC voltage signal is supplied to said common mode voltage setting input of said differential transimpedance amplifier circuit.

11. The capacitive detection system according to claim 9, wherein said multiplexer is operatively coupled to said first mixer by means of an adjustable phase shifter, so that said multiplexer is controllable by different phase positions of said modulated AC voltage signal.

12. The capacitive detection system according to claim 9, wherein an output signal at the output of said differential transimpedance amplifier circuit is filtered by means of a bandpass filter and subsequently mixed with the second AC voltage signal of said second AC signal generator.

\* \* \* \* \*